(12) United States Patent
Lee et al.

(10) Patent No.: US 10,199,600 B2
(45) Date of Patent: Feb. 5, 2019

(54) DISPLAY DEVICE AND METHOD FOR FABRICATING THE DISPLAY DEVICE

(71) Applicant: Samsung Display Co., Ltd., Yongin, Gyeonggi-Do (KR)

(72) Inventors: Innam Lee, Seoul (KR); Suk Choi, Seongnam-si (KR); Youngkuil Joo, Asan-si (KR); Kyung Woo Han, Seoul (KR)

(73) Assignee: Samsung Display Co., Ltd. (KR)

( * ) Notice: Subject to any disclaimer, the term of this patent is extended or adjusted under 35 U.S.C. 154(b) by 111 days.

(21) Appl. No.: 14/195,377

(22) Filed: Mar. 3, 2014

(65) Prior Publication Data

US 2015/0049281 A1 Feb. 19, 2015

(30) Foreign Application Priority Data

Aug. 14, 2013 (KR) .................. 10-2013-0096695

(51) Int. Cl.
*G02F 1/1333* (2006.01)
*H01L 51/52* (2006.01)

(52) U.S. Cl.
CPC .... *H01L 51/5253* (2013.01); *G02F 1/133305* (2013.01); *H01L 51/5293* (2013.01); *H01L 2251/5338* (2013.01)

(58) Field of Classification Search
CPC .................. G02F 1/133305; G02F 1/133603
See application file for complete search history.

(56) References Cited

U.S. PATENT DOCUMENTS

| | | | |
|---|---|---|---|
| 7,251,075 B2 | 7/2007 | Trapani et al. | |
| 7,692,759 B2 | 4/2010 | Escuti et al. | |
| 8,189,165 B2 | 5/2012 | Umemoto et al. | |
| 8,257,802 B2 | 9/2012 | Inoue et al. | |
| 2005/0030447 A1* | 2/2005 | Hsu ..................... | G02F 1/13363 349/102 |
| 2009/0121226 A1 | 5/2009 | Namose | |
| 2009/0322999 A1* | 12/2009 | Sano .................. | G02F 1/133308 349/122 |
| 2011/0234079 A1 | 9/2011 | Eom et al. | |
| 2012/0062829 A1 | 3/2012 | Matsuda et al. | |
| 2012/0105795 A1 | 5/2012 | Matsuda et al. | |
| 2012/0107530 A1* | 5/2012 | Morishima ............ | B41M 5/405 428/32.31 |
| 2012/0216714 A1 | 8/2012 | Onouchi et al. | |

(Continued)

FOREIGN PATENT DOCUMENTS

| | | |
|---|---|---|
| CN | 101133348 A | 2/2008 |
| CN | 102967979 A | 3/2013 |

(Continued)

*Primary Examiner* — Edmond Lau
(74) *Attorney, Agent, or Firm* — Innovation Counsel LLP

(57) ABSTRACT

A display device may include a display panel that includes a plurality of display elements. The display device may further include a protective member overlapping the display panel. The display device may further include an optical member disposed between the display panel and the protective member and configured to prevent light reflected by the display panel from reaching the protective member. The optical member may include a plurality of directional members. The plurality of directional members may have an optic axis.

7 Claims, 13 Drawing Sheets

(56) References Cited

U.S. PATENT DOCUMENTS

| | | | | |
|---|---|---|---|---|
| 2013/0002133 A1* | 1/2013 | Jin | ................... | H01L 51/524 |
| | | | | 313/511 |
| 2013/0083276 A1* | 4/2013 | Iwahashi | ................. | B41M 3/06 |
| | | | | 349/117 |
| 2014/0159001 A1* | 6/2014 | Park | ................... | H01L 51/52 |
| | | | | 257/40 |
| 2014/0232728 A1* | 8/2014 | Eakin | ................. | H01L 51/5281 |
| | | | | 345/501 |
| 2015/0168767 A1* | 6/2015 | Yonemura | ......... | G02F 1/133308 |
| | | | | 349/58 |

FOREIGN PATENT DOCUMENTS

| | | |
|---|---|---|
| JP | 2004-294983 | 10/2004 |
| JP | 2005-070096 | 3/2005 |
| JP | 2011113704 A | 6/2011 |
| KR | 10-2009-0101628 | 9/2009 |
| KR | 10-2011-0124717 | 11/2011 |
| KR | 10-2013-0037126 | 4/2013 |

\* cited by examiner

DISPLAY DEVICE AND METHOD FOR FABRICATING THE DISPLAY DEVICE

CROSS-REFERENCE TO RELATED APPLICATION

This U.S. non-provisional patent application claims priority and benefit under 35 U.S.C. § 119 of Korean Patent Application No. 10-2013-0096695, filed on Aug. 14, 2013, in the Korean Intellectual Property Office, the disclosure of which is incorporated herein by reference in its entirety.

BACKGROUND

The invention is related to flexible display devices and methods for fabricating the flexible display devices.

A flexible display device may include a flexible display panel and one or more functional optical films. The functional optical film(s) may overlap the flexible display panel and may be bent or folded along with the flexible display panel.

SUMMARY

Embodiments of the invention may be related to a display device (e.g., a flexible display device) with optimized image visibility and/or a minimized thickness.

Embodiments of the invention may be related to a method for fabricating a display device (e.g., a flexible display device) with a minimized thickness.

Some embodiments of the invention may be related to a display device that may include a display panel. The display panel may include a plurality of display elements. The display device may further include a protective member overlapping the display panel. The display device may further include an optical member disposed between the display panel and the protective member and configured to prevent light reflected by the display panel from reaching the protective member. The optical member may include a first plurality of directional members. The first plurality of directional members may have a first optic axis.

The first plurality of directional members may include at least one of liquid crystal molecules and mesogens.

The optical member may include a polarizing member that may include the first plurality of directional members. The optical member may further include a phase difference member disposed between the display panel and the polarizing member. The first plurality of directional members may include liquid crystal molecules. The display device may include a layer (e.g., an overcoat layer and/or an alignment layer) disposed between the polarizing member and the phase difference member and configured to perform at least one of covering the liquid crystal molecules and orienting the liquid crystal molecules in a predetermined direction.

The optical member may include a phase difference member that may the first plurality of directional members. The optical member may further include a polarizing member disposed between the protective member and the phase difference member. The first plurality of directional members may include mesogens. The display device may include a layer (e.g., an overcoat layer and/or an alignment layer) disposed between the phase difference member and the display panel and configured to perform at least one of covering the mesogens and orienting the mesogens in a predetermined direction.

The optical member may include a second plurality of directional members. The second plurality of directional members may overlap the first plurality of directional members and may have a second optic axis that is oriented at an acute angle with respect to the first optic axis. At least one of the first optic axis and the second optic axis may be at least one of an optic axis of a liquid crystal molecule and an optic axis of a mesogen. The acute angle may be substantially equal to 45 degrees.

The display device may include a black matrix disposed between the display panel and the protective member. The black matrix may overlap a non-display region of the display panel. The display device may further include a planarization layer that may overlap a display region of the display panel. A portion of the planarization layer may be disposed between two portions of the black matrix.

The planarization layer may be disposed between the first plurality of directional members and the protective member.

The plurality of display elements may include organic light emitting diodes.

Some embodiments of the invention may be related to a method for fabricating a display device. The method may include the following steps: providing a first plurality of directional members such that the first plurality of directional members overlaps a film; orienting the first plurality of directional members in a first direction; and providing a display panel such that the first plurality of directional members is positioned between the display panel and a portion of the film, the display panel including a plurality of display elements.

The display device may be obtained by cutting a combination that includes the film, the first plurality of directional members, and the display panel into discrete units, wherein the display device may be one of these discrete units.

The display device may be obtained by cutting a combination that includes the film and the first plurality of directional members into discrete units and combining one of the discrete units with the display panel.

The first plurality of directional members may include at least one of liquid crystal molecules and mesogens.

The method may include the following steps: using a roller to move the film with respect to a supplying part; and using the supplying part to provide the first plurality of directional members onto the film.

The method may include the following step: providing a second plurality of directional members, wherein the second plurality of directional members may overlap the first plurality of directional members and may be oriented in a second direction that is at an acute angle with respect to the first direction.

The first plurality of directional members may include liquid crystal molecules. The second plurality of directional members may include mesogens positioned between the display panel and the liquid crystal molecules. The method may include the following step: before the step of providing the display panel, providing an alignment layer on the second plurality of directional members to orient the second plurality of directional members in the second direction.

The method may include the following step: before the step of providing the display panel, providing an alignment layer on the first plurality of directional members to orient the first plurality of directional members in the first direction.

A flexible display device according to some embodiments of the invention includes a flexible display panel and a flexible window member combined with the flexible display panel. The flexible display panel includes a plurality of display elements.

The flexible window member includes a protecting member, a polarizing member disposed between the flexible display panel and the protecting member, and a phase difference member disposed between the flexible display panel and the polarizing member. At least one of the polarizing member and the phase difference member includes directional members, or directors, aligned on a bottom surface of the protecting member.

The directors of the polarizing member may include liquid crystal molecules aligned on the bottom surface of the protecting member. The directors of the phase difference member may include reactive mesogens aligned on a bottom surface of the polarizing member.

An optic axis of the phase difference member may be oriented at an angle of about 45 degrees with respect to an optic axis of the polarizing member.

The flexible window member may further include an overcoat layer disposed on a bottom surface of the phase difference member to cover the aligned reactive mesogens.

According to some embodiments of the invention, a method for fabricating a flexible display device may include forming a flexible window member, providing a flexible display panel, and combining the flexible window member with the flexible display panel. The flexible window member includes a protecting member, a polarizing member disposed on the protecting member, and a phase difference member disposed on the polarizing member.

Forming the flexible window member according to some embodiments includes aligning directional members, or directors, constituting at least one of the polarizing member and the phase difference member on the protecting member using a roll-to-roll method.

An alignment axis of the reactive mesogens may be oriented at an angle of about 45 degrees with respect to an alignment axis of the liquid crystal molecules when the phase difference member is formed.

In some embodiments, forming the flexible window member further includes forming a black matrix overlapping with a first portion of the protecting member, and forming a planarization layer overlapping with a second portion of the protecting member.

In some embodiments, forming the flexible window member includes aligning liquid crystal molecules on the protecting member to form the polarizing member, forming an overcoat layer on the polarizing member, and adhering a phase difference film to the overcoat layer to form the phase difference member.

In some embodiments, forming the flexible window member includes adhering a polarizing film to the protecting member to form the polarizing member, aligning reactive mesogens on the polarizing member to form the phase difference member, and forming an overcoat layer on the phase difference member.

DETAILED DESCRIPTION OF THE EMBODIMENTS

Figure 1:
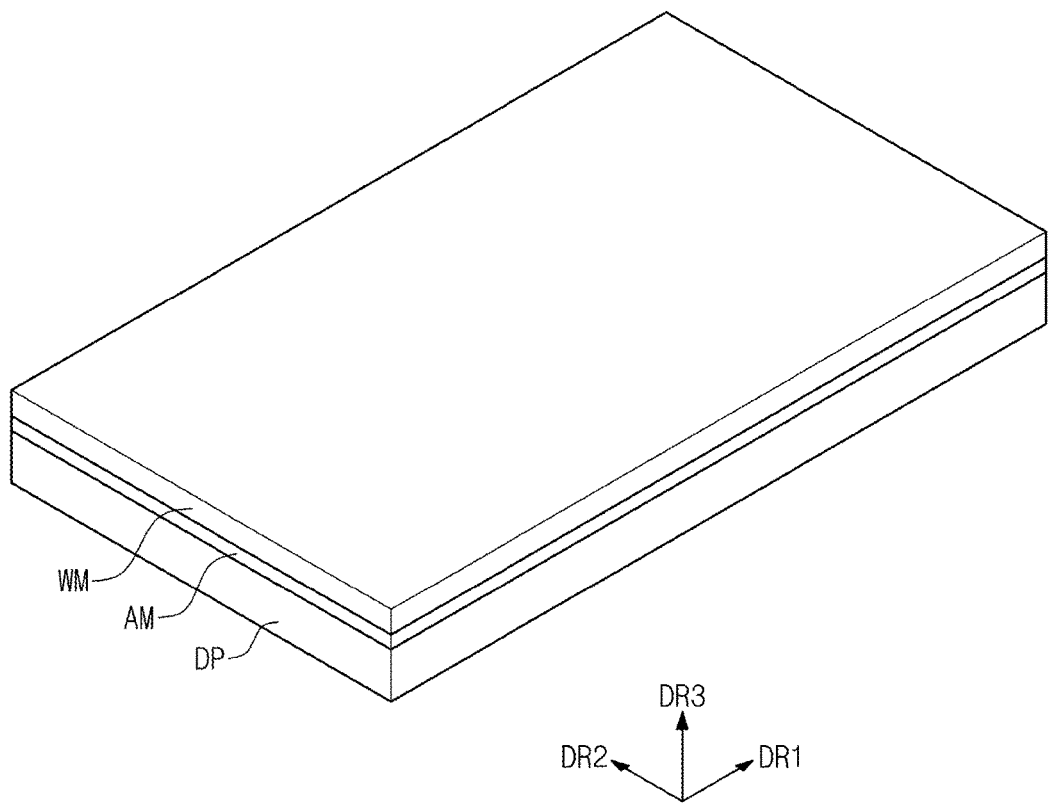
FIG. 1 is a perspective view illustrating a display device (e.g., a flexible display device) according to some embodiments of the invention.

Advantages and features of example embodiments of the invention will now be described more fully hereinafter with reference to the accompanying drawings. The invention is not limited to the described example embodiments and may be implemented in various forms.

The terminology used herein is for the purpose of describing particular embodiments and is not intended to limit the invention. As used herein, the singular terms "a", "an", and "the" may include plural forms as well, unless the context clearly indicates otherwise. As used herein, the term "and/or" may include any and all combinations of one or more of the associated items. If an element is referred to as being "connected" or "coupled" to another element, it may be directly connected or coupled to the other element; alternatively, one or more intervening elements may be present.

If an element, such as a layer, region, or substrate, is referred to as being "on" another element, it can be directly on the other element; alternatively, one or more intervening elements may be present. In contrast, the term "directly" may mean that there are no intended intervening elements (except possible environmental elements, e.g., air).

The terms "comprises", "comprising", "includes", and/or "including" may specify the presence of stated features, integers, steps, operations, elements, and/or components, but do not preclude the presence or addition of one or more other features, integers, steps, operations, elements, components, and/or groups thereof.

Shapes of views illustrated in the described embodiments and/or the accompanying drawings may be modified according to manufacturing techniques and/or allowable errors. Embodiments of the invention may not be limited to specific shapes illustrated in the views.

Although the terms "first", "second", "third", etc. may be used herein to describe various elements, these elements should not be limited by these terms. These terms may be used to distinguish one element from another element. Thus, a first element may be termed a second element without departing from the teachings of the present invention. The description of an element as a "first" element may not require or imply the presence of a second element or other elements. The terms "first", "second", etc. may also be used herein to differentiate different categories of elements. For conciseness, the terms "first", "second", etc. may represent "first-type (or first-category)", "second-type (or second-category)", etc., respectively.

The same reference numerals or the same reference designators may denote identical elements and/or analogous elements in the specification.

Figure 2:
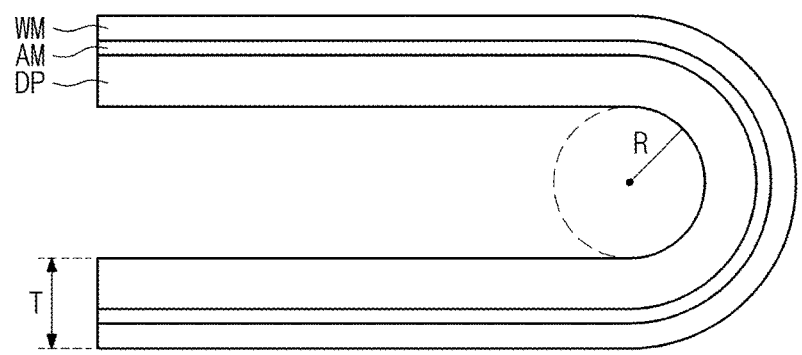
FIG. 2 is a cross-sectional view illustrating a folded state of a display device (e.g., a flexible display device) according to some embodiments of the invention.
Figure 3A:
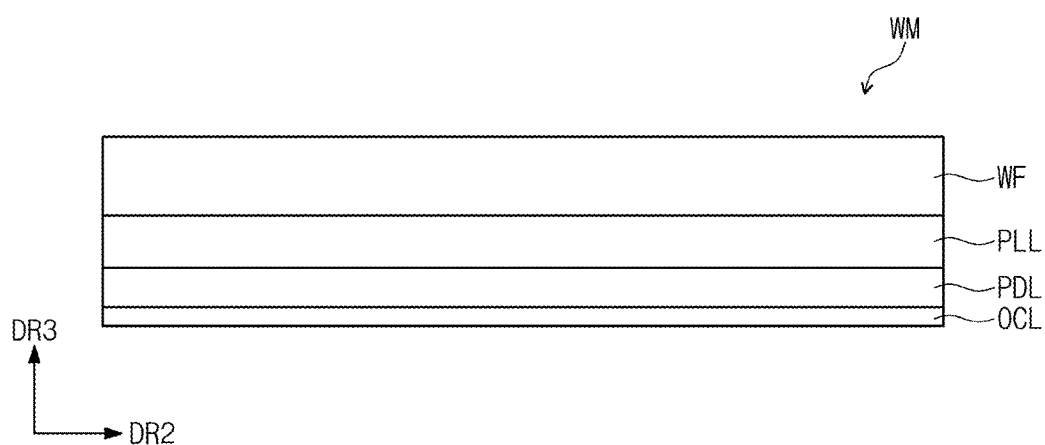
FIG. 3a is a cross-sectional view illustrating a window member of a display device (e.g., a flexible display device) according to some embodiments of the invention.
Figure 3B:
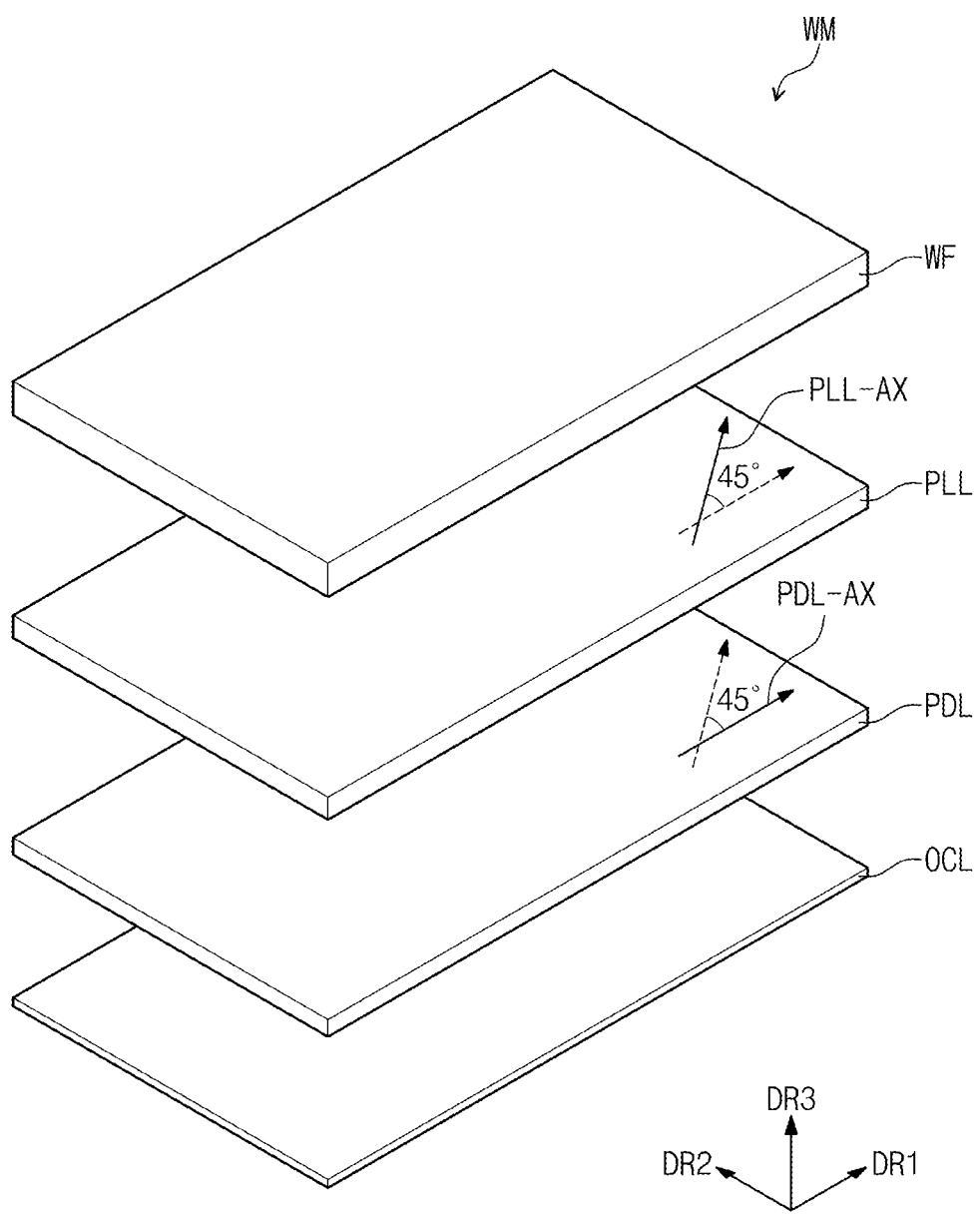
FIG. 3b is an exploded perspective view illustrating a window member of a display device (e.g., a flexible display device) according to some embodiments of the invention.

FIG. 1 is a perspective view illustrating a display device, which may be a substantially flexible display device, according to some embodiments of the invention. FIG. 2 is a cross-sectional view illustrating a folded state of the display device according to some embodiments of the invention. FIG. 3a is a cross-sectional view illustrating a window member of the display device according to some embodiments of the invention. FIG. 3b is an exploded perspective view illustrating a window member of a display device (e.g., a flexible display device) according to some embodiments of the invention.

As illustrated in FIGS. 1 to 3b, the display device may include a display panel DP, which may be a substantially flexible display panel, and a window member WM, which may be a substantially flexible window member. The window member WM may overlap and/or may be combined with the display panel DP. The window member WM may be combined with the display panel DP by a transparent adhesive member AM. The adhesive member AM may include one or more ultraviolet-curable pressure sensitive adhesives (UV-curable PSA). The display device may further include a touch screen member (not shown) disposed between the display panel DP and the window member WM.

The display panel DP may include a flexible base substrate (not shown) and may include a plurality of signal lines (not shown) and a plurality of pixels (not shown) disposed on the flexible base substrate (not shown). The plurality of pixels may be electrically connected to the plurality of signal lines. The pixels may include display elements (not shown). The display elements may generate an image in response to signals received from the signal lines.

At least a portion of the display device may be bent or rolled to form a curved portion. As illustrated in FIGS. 1 and 2, the display device may have a display surface configured to display an image and disposed parallel to a plane that is defined by a first direction DR1 (or first coordinate axis DR1) and a second direction DR2 (or second coordinate axis DR2). The display device may be folded about a fold-axis parallel to the second direction DR2.

The display device may be folded so that two portions of the display device may overlap each other. The display device may have a predetermined radius R of curvature in a curved portion resulted from bending and/or folding of the display device. If the display device has a predetermined thickness T in a thickness direction DR3 (or according to a third coordinate axis DR3), the display device has a strain S expressed by the following equation. According to the equation, if the thickness T of the display device is small, the display device has a small strain.

$$S = \frac{\pi(R+T/2) - \pi R}{\pi R} = \frac{T}{2R} \quad \text{[Equation]}$$

As illustrated in FIGS. 3a and 3b, the window member WM may include a protecting member WF, a polarizing member (e.g., polarizing layer) PLL, and a phase difference member (e.g., phase difference layer) PDL. In order to reduce the thickness of the display device, at least one of the polarizing member PLL and the phase difference member PDL may include directional members, or directors, aligned on a bottom surface of the protecting member WF. The directors may be oriented in one or more particular directions for controlling and/or affecting characteristics of light that is transmitted through the polarizing member PLL and/or the phase difference member PDL. The directors may be directly coated on the protecting member WF, such that the thickness or thicknesses of the polarizing member PLL and/or the phase difference member PDL may be minimized.

The protecting member WF may include a plastic film or a thin glass substrate. The plastic film may have sufficient transparent property, mechanical strength, thermal stability, moisture shielding property, and isotropy. For example, the plastic film may include at least one of a polyester-based resin (e.g., polyethyleneterephthalate, polyethyleneisophthalate, or polybutyleneterephthalate), a cellulose-based resin (e.g., diacetylcellulose or triacetylcellulose), a polycarbonate-based resin, and an acryl-based resin.

The polarizing layer PLL may be disposed on the bottom surface of the protecting member WF. The polarizing layer PLL may include liquid crystal molecules that may function as the directors. The polarizing layer PLL may be an O-type polarizing layer or an E-type polarizing layer.

The O-type polarizing layer may include a dichroic dye that is used as a guest and may include liquid crystal molecules that are used as a host. The liquid crystal molecules may be nematic liquid crystal molecules. The dichroic dye and the nematic liquid crystal molecules may be arranged in a fixed direction, so that the O-type polarizing layer may have an optic axis that is oriented according to a predetermined direction.

The E-type polarizing layer may include lyotropic liquid crystal molecules. The lyotropic liquid crystal molecules may be discotic liquid crystal molecules. The discotic liquid crystal molecules may be arranged in a specific direction, so that the E-type polarizing layer may have an optic axis that is oriented according to a predetermined direction.

An alignment layer (not shown) may be disposed on the bottom surface of the protecting member WF in order to align the liquid crystal molecules. The alignment layer includes an alignment material such as polyimide or polyamide. An alignment direction of the liquid crystal molecules may depend on a rubbing axis of the alignment layer.

The phase difference layer PDL may be disposed on a bottom surface of the polarizing layer PLL, such that the polarizing layer PLL may be positioned between the protecting member WF and the phase difference layer PDL. The phase difference layer PDL may include a reactive mesogen that is used as a director. The reactive mesogen may include a molecule that has a liquid crystal phase and an end group capable of being polymerized. The reactive mesogen may include a calamitic mesogen that has a nematic liquid crystal phase. A reactive end group of the reactive mesogen may include an acrylic group or methacrylic group capable of performing radical polymerization. The phase difference layer PDL may be or may include a cross-linked polymer layer.

As illustrated in FIGS. 3a and 3b, the window member WM may further include an overcoat layer OCL disposed on a bottom surface of the phase difference layer PDL, such that the polarizing layer PLL and the phase difference layer PDL may be disposed between the protecting member WF and the overcoat layer OCL. The overcoat layer OCL may cover the aligned reactive mesogens. The overcoat layer OCL may protect the phase difference layer PDL like a protecting film included in a phase difference film. The overcoat layer OCL may cover the phase difference layer PDL in order to avoid exposure of the phase difference layer PDL.

The overcoat layer OCL may include an organic layer and/or an inorganic layer. The overcoat layer OCL may include at least one of a siloxane-based organic material, silicon nitride, and silicon oxide. The overcoat layer OCL may have a multi-layer structure.

Figure 4:
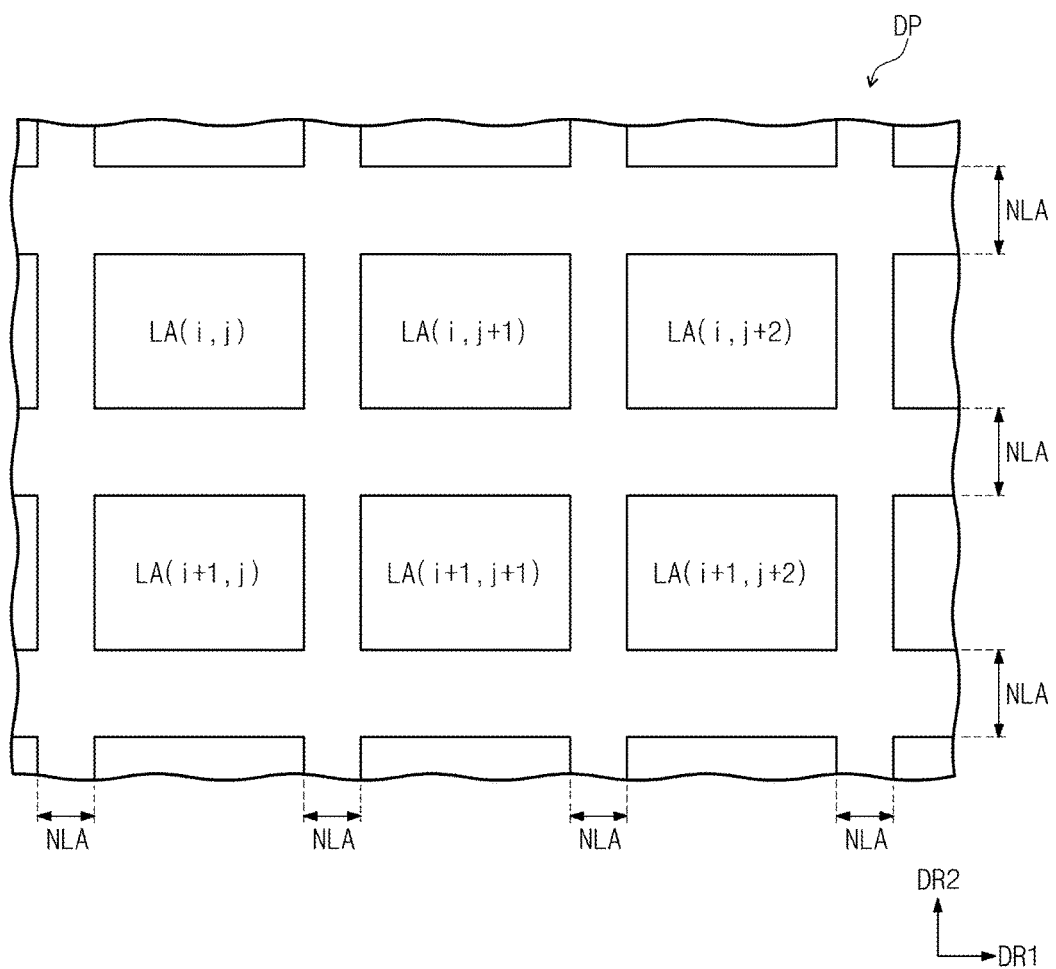
FIG. 4 is a plan view illustrating a portion of a display panel (e.g., a flexible display panel) of a display device (e.g., a flexible display device) according to some embodiments of the invention.
Figure 5:
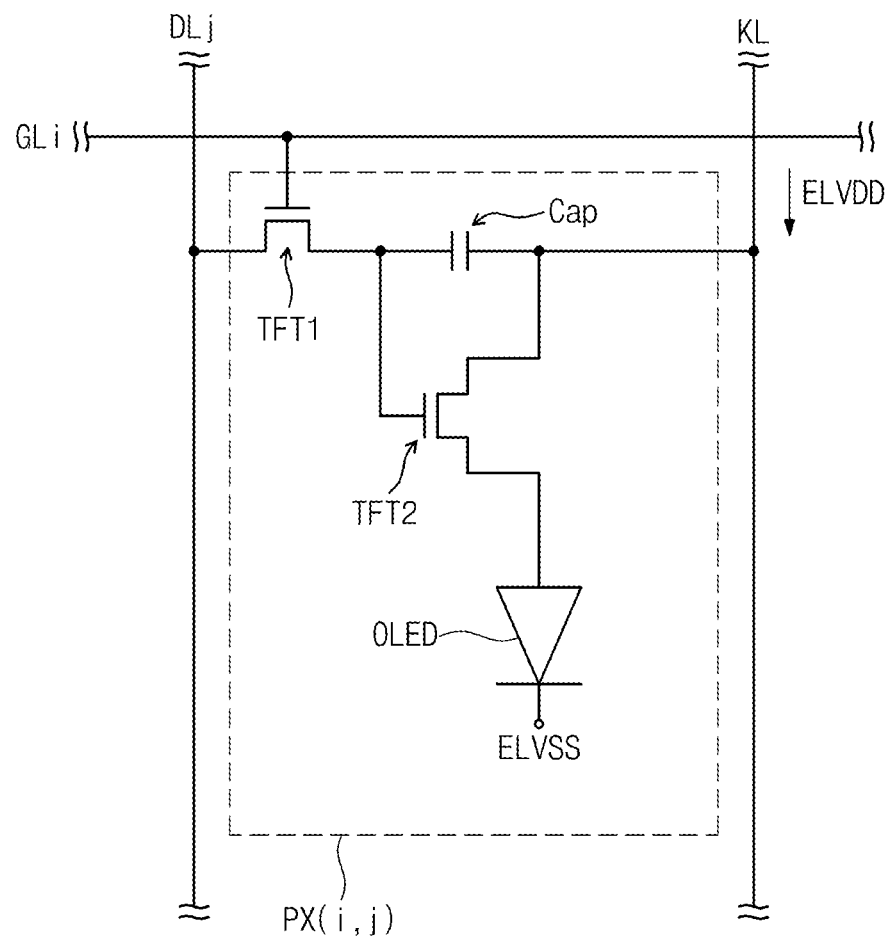
FIG. 5 is an equivalent circuit diagram of a pixel of a display device (e.g., a flexible display device) according to some embodiments of the invention.
Figure 6:
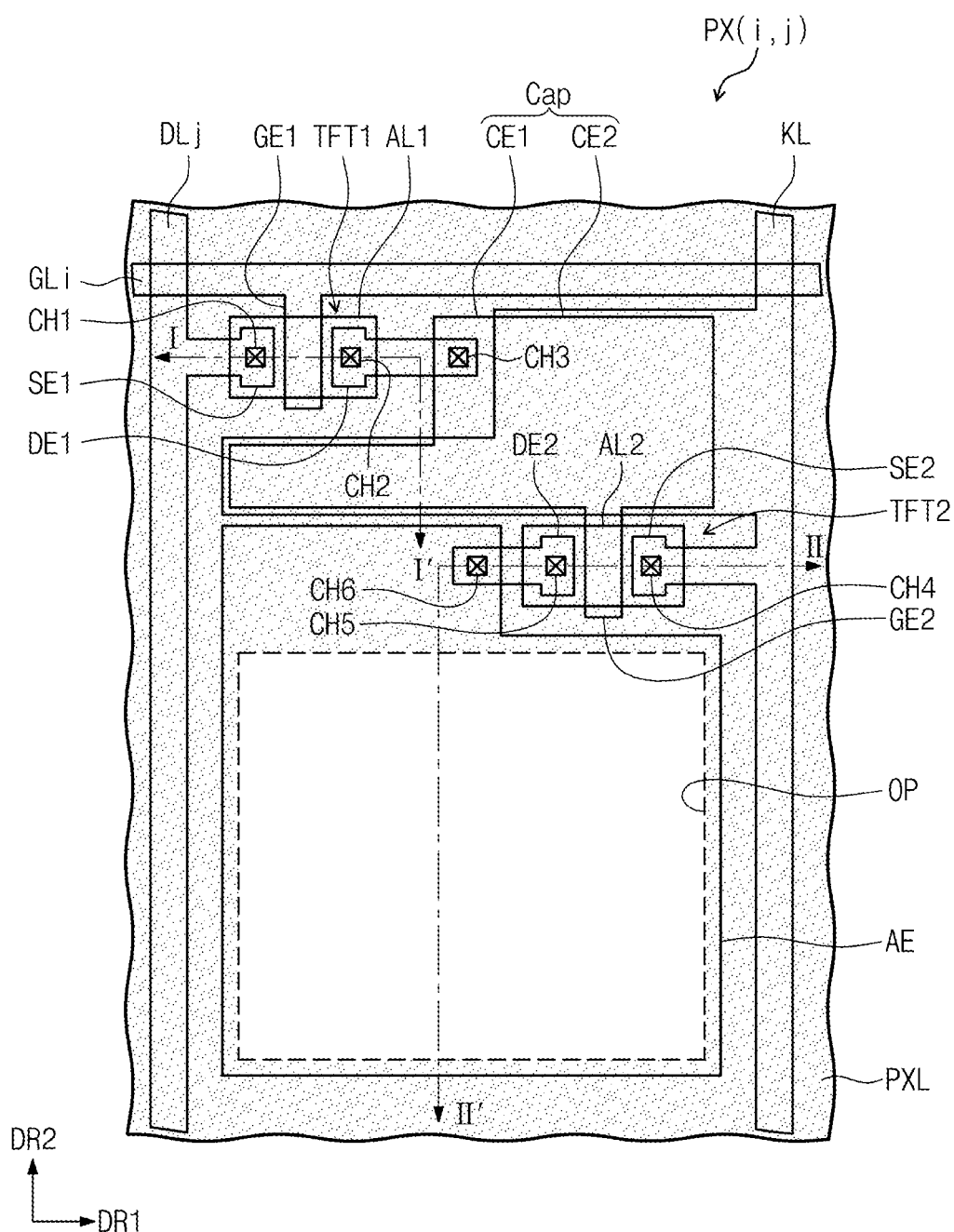
FIG. 6 is a layout view (or plan view) illustrating a pixel of a display device (e.g., a flexible display device) according to some embodiments of the invention.
Figure 7:
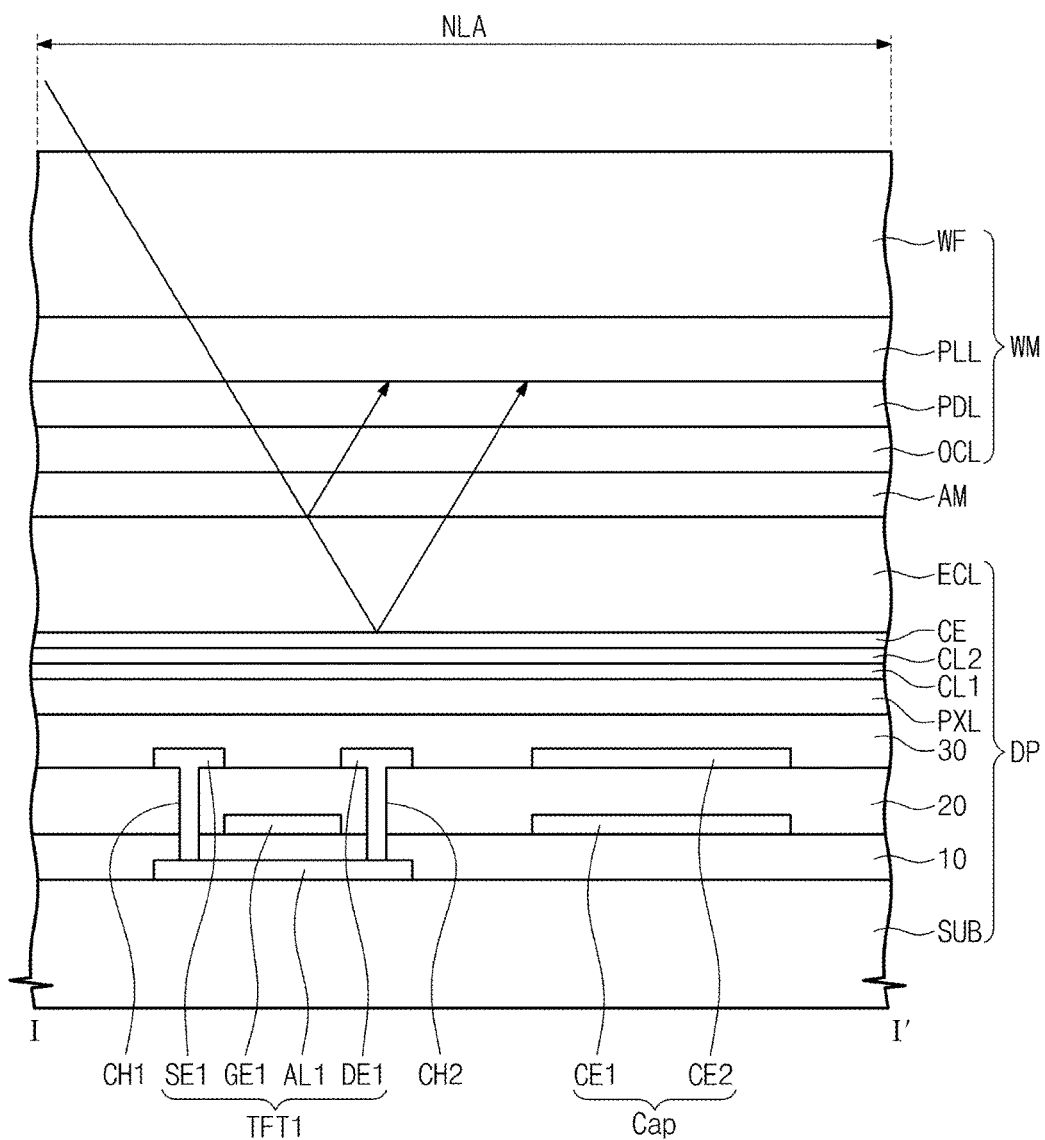
FIG. 7 is a cross-sectional view taken along a line I-I' indicated in FIG. 6.
Figure 8:
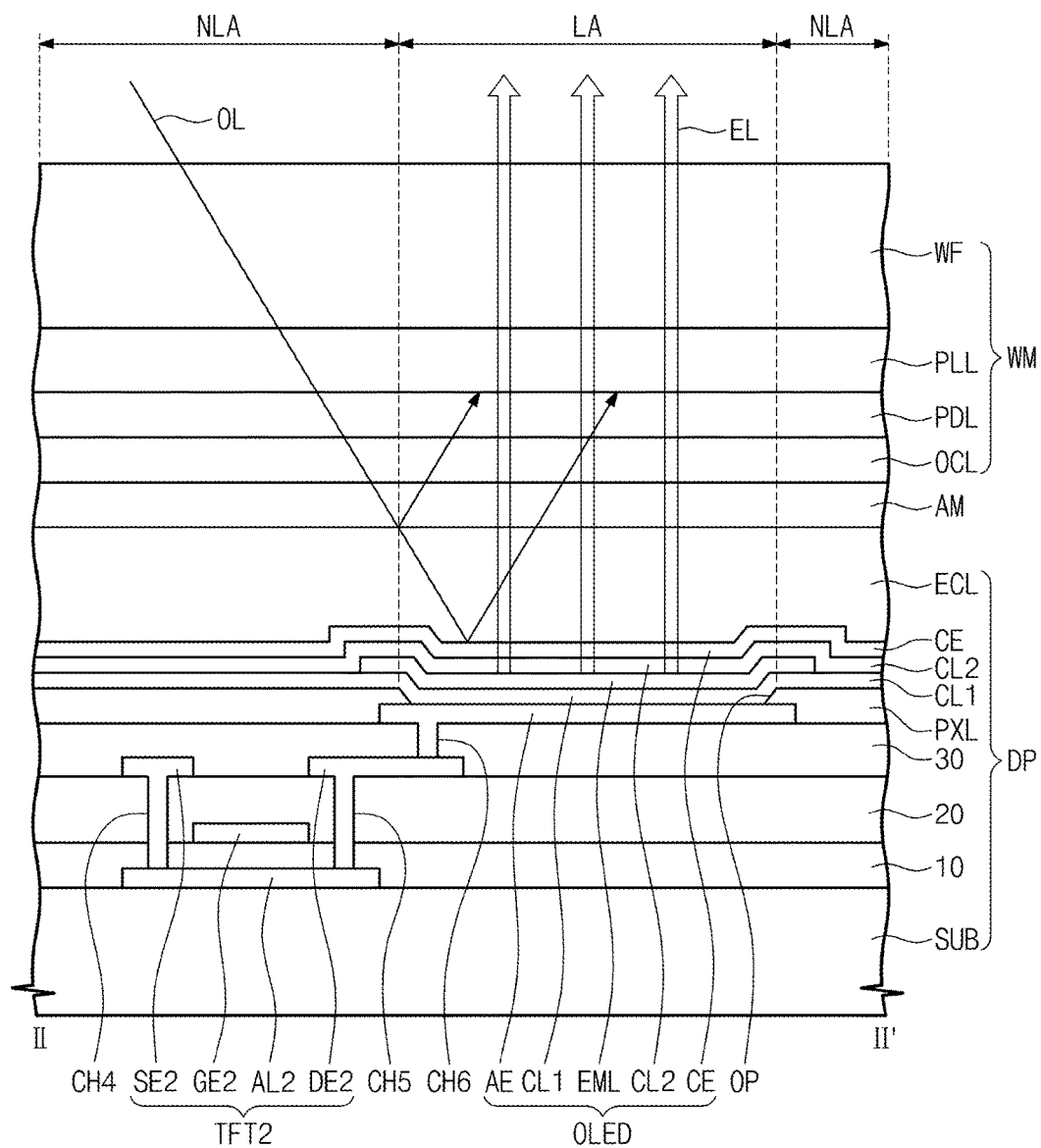
FIG. 8 is a cross-sectional view taken along a line II-II' indicated in FIG. 6.

FIG. 4 is a plan view illustrating a portion of the display panel DP (illustrated in FIGS. 1 and 2) according to some embodiments of the invention. FIG. 5 is an equivalent circuit diagram of a pixel of the display panel DP according to some embodiments of the invention. FIG. 6 is a layout view (or plan view) illustrating a pixel of the display panel DP according to some embodiments of the invention. FIG. 7 is a cross-sectional view taken along a line I-I' indicated in FIG. 6. FIG. 8 is a cross-sectional view taken along a line II-II' indicated in FIG. 6.

As illustrated in FIG. 4, the display panel DP may include a plurality of luminous regions and a non-luminous region NLA surrounding the luminous regions. In FIG. 4, six luminous regions LA(i,j) to LA(i+1,j+2) are illustrated as an example.

Display elements (not shown) of corresponding pixels (not shown) are disposed in the luminous regions LA(i,j) to LA(i+1,j+2). Signal lines are disposed in the non-luminous regions NLA.

The luminous regions LA(i,j) to LA(i+1,j+2) and the non-luminous region NLA may be defined by a pixel defining layer PXL illustrated in FIG. 6, FIG. 7, and FIG. 8. The pixel defining layer PXL may be disposed in the non-luminous region NLA, and the luminous regions LA(i,j) to LA(i+1,j+2) may correspond to openings OP of the pixel defining layer PXL.

FIG. 5 illustrates an equivalent circuit of a pixel PX(i,j). Elements of the pixel PX(i,j) may not be limited to the elements illustrated in FIG. 5. Elements of the pixel PX(i,j) may be modified in view of FIG. 5. The pixel PX(i,j) may receive a gate signal from an i-th gate line GLi. The pixel PX(i,j) may receive a data signal from a j-th data line DLj. The pixel PX(i,j) may receive a first power voltage ELVDD from a power line KL.

The pixel PX(i,j) may include an organic light emitting diode OLED, which may function as a display element. The pixel PX(i,j) may include a first thin film transistor TFT1, a second thin film transistor TFT2, and a capacitor Cap that are used as a circuit part for driving (and/or controlling) the organic light emitting diode OLED.

The first thin film transistor TFT 1 may output the data signal transmitted by the j-th data line DLj in response to the gate signal transmitted by the i-th gate line GLi. The capacitor Cap may be charged with a charge amount that corresponds to a difference between the first power voltage ELVDD and a voltage corresponding to the data signal received from the first thin film transistor TFT1.

The second thin film transistor TFT2 is connected to the organic light emitting diode OLED. In response to the charge amount stored in the capacitor Cap, the second thin film transistor TFT2 may control a driving current that flows through the organic light emitting diode OLED.

The organic light emitting diode OLED may include a first electrode (not shown) connected to the second thin film transistor TFT2 and may include a second electrode (not shown) configured for receiving a second power voltage ELVSS. The second power voltage ELVSS has a lower level (or lower value) than the first power voltage ELVDD. The organic light emitting diode OLED may include an organic light emitting layer disposed between the first electrode and the second electrode. The organic light emitting diode OLED may emit light during a turn-on period of the second thin film transistor TFT2.

The pixel PX(i,j) may include a different display element, alternative to or in addition to the organic light emitting diode OLED. In an embodiment, the display panel DP may be an electrophoretic display panel and may include two electrodes and electrophoretic particles that constitute a display element. In an embodiment, the display panel DP may be an electrowetting display panel and may include two electrodes and electronic inks that function as a display element. Circuits for driving (and/or controlling) the display element may be configured according to the configuration of the display element.

In an embodiment, the display panel DP may be an organic light emitting display panel that includes an organic light emitting diode OLED. As illustrated in FIGS. 6 to 8. The display panel DP may include a base substrate SUB, a gate line GLi, a data line DLj, a pixel PX(i,j), and a sealing layer ECL. The window member WM is combined with and/or connected to the sealing layer ECL.

The base substrate SUB may be or may include a flexible plastic substrate. The gate line GLi, the data line DLj, the power line KL, and the pixel PX(i,j) are disposed on the base substrate SUB.

A first semiconductor pattern AL1 (i.e., a semiconductor pattern of the first thin film transistor TFT1) and a second semiconductor pattern AL2 (i.e., a semiconductor pattern of the second thin film transistor TFT2) are disposed on the base substrate SUB. A first insulating layer 10 covering both the first semiconductor pattern AL1 and the second semiconductor pattern AL2 may be disposed on the base substrate SUB. The first insulating layer 10 includes an organic layer and/or an inorganic layer. The first insulating layer 10 may include a plurality of thin layers.

A first control electrode GE1 (i.e., a control electrode of the first thin film transistor TFT1) and a second control electrode GE2 (i.e., a second control electrode of the second thin film transistor TFT2) are disposed on the first insulating layer 10. A first electrode CE1 of the capacitor Cap is disposed on the first insulating layer 10.

A second insulating layer 20 is disposed on the first insulating layer 10. The second insulating layer 20 covers the first control electrode GE1, the second control electrode GE2, and the first electrode CE1. The second insulating layer 20 includes an organic layer and/or an inorganic layer. The second insulating layer 20 may include a plurality of thin layers.

A first input electrode SE1 (i.e., an input electrode of the first thin film transistor TFT1) and a first output electrode DE1 (i.e., an output electrode of the first thin film transistor TFT1) are disposed on the second insulating layer 20. A second input electrode SE2 (i.e., a second input electrode of the second thin film transistor TFT2) and a second output electrode DE2 (i.e., a second output electrode of the second thin film transistor TFT2) are disposed on the second insulating layer 20. A second electrode CE2 of the capacitor Cap is disposed on the second insulating layer 20.

The first input electrode SE1 is connected to the first semiconductor pattern AL1 through a first through-hole CH1 penetrating the insulating layers 10 and 20. The first output electrode DE1 is connected to the first semiconductor pattern AL1 through a second through-hole CH2 penetrating the insulating layers 10 and 20. The first output electrode DE1 is connected to the first electrode CE1 through a third through-hole CH3 penetrating the second insulating layer 20. The second input electrode SE2 is connected to the second semiconductor pattern AL2 through a fourth through-hole CH4 penetrating the insulating layers 10 and 20. The second output electrode DE2 is connected to the second semiconductor pattern AL2 through a fifth through-hole CH5 penetrating the insulating layers 10 and 20. In some embodiments of the invention, the first thin film transistor TFT1 and the second thin film transistor TFT2 may be modified to have bottom gate structures.

A third insulating layer 30 is disposed on the second insulating layer 20 to cover the first input electrode SE1, the first output electrode DE1, the second input electrode SE2, and the second output electrode DE2. The third insulating layer 30 includes an organic layer and/or an inorganic layer. The third insulating layer 30 may include a plurality of thin layers.

A pixel defining layer PXL and the organic light emitting diode OLED are disposed on the third insulating layer 30. The organic light emitting diode OLED includes an anode AE, a first common layer CL1, an organic light emitting layer EML, a second common layer CL2, and a cathode CE that are sequentially stacked. The anode AE is connected to the second output electrode DE2 through a sixth through-hole CH6 penetrating the third insulating layer 30. Positions of the anode AE and the cathode CE may be switched depending on a predetermined light emitting direction of the organic light emitting diode OLED.

The anode AE is disposed on the third insulating layer 30. An opening OP of the pixel defining layer PXL exposes the anode AE. The first common layer CL1 is disposed on the anode AE. The first common layer CL1 is disposed on a non-luminous region as well as a luminous region corresponding to the opening OP. In an embodiment, the first common layer CL1 is disposed on an entire top surface of the base substrate SUB. The first common layer CL1 may include a hole-injection layer. The first common layer CL1 may further include a hole-transfer layer.

The organic light emitting layer EML is disposed on the first common layer CL1. The organic light emitting layer EML is disposed on a region corresponding to the opening OP. The second common layer CL2 is disposed on the organic light emitting layer EML. The second common layer CL2 may be disposed on the entire top surface of the base substrate SUB, like the first common layer CL1. The second common layer CL2 may include an electron-injection layer. The second common layer CL2 may further include an electron-transfer layer. The cathode CE is disposed on the second common layer CL2. The cathode CE may be disposed on the entire top surface of the base substrate SUB.

The sealing layer ECL is disposed on the cathode CE. The sealing layer ECL overlaps with the non-luminous region NLA and the luminous regions LA. The sealing layer ECL includes an organic layer and/or an inorganic layer. In some embodiments of the invention, a fourth insulating layer for planarization may be further disposed between the cathode CE and the sealing layer ECL. In some embodiments, the sealing layer ECL may be replaced with a sealing substrate.

The window member WM is disposed on the sealing layer ECL. Incident light OL may be inputted to the display panel DP from the outside of the display device through the protecting member WF, the polarizing layer PLL, and the phase difference layer PDL.

The polarizing layer PLL may linearly polarize the incident light OL to generate linearly polarized incident light. The linearly polarized incident light may pass through the phase difference layer PDL and then may be reflected at the display panel DP, resulting in reflected light. The reflected light from the display panel DP may pass through the phase difference layer PDL and then may be incident on the polarizing layer PLL. A phase of the reflected light may be substantially different from a phase of the linearly polarized incident light, depending on a traveling path of the linearly polarized incident light. Because of the phase difference, the reflected light may not pass through the polarizing layer PLL and may not be visible to a viewer outside the display device.

Light EL generated from the organic light emitting diode OLED may pass through the window member WM, including the phase difference layer PDL and the polarizing layer PLL, and may be visible to a viewer outside the display device. The polarizing layer PLL and the phase difference layer PDL may provide the light EL generated from the organic light emitting diode OLED to the viewer outside the display device and may prevent the reflection of the incident light OL from being visible to the viewer. Thus, visibility of the flexible display device may be optimized.

The phase difference layer PDL may be a $\lambda/4$ phase difference layer. The $\lambda/4$ phase difference layer has an optic axis PDL-AX oriented at an angle of 45 degrees with respect to the optic axis PLL-AX of the polarizing layer PLL (Referring to FIG. 3b). The linearly polarized incident light passes through the phase difference layer PDL to be left-circularly polarized. The left-circularly polarized light is reflected by the display panel DP to be right-circularly polarized. The right-circularly polarized light passes through the $\lambda/4$ phase difference layer to be linearly polarized. At this time, the linearly polarized light is polarized in a direction perpendicular to the optic axis of the polarizing layer PLL. Thus, the linearly polarized light may not pass through the polarizing layer PLL.

According to embodiments of the invention, the display device, including the polarizing layer PLL and the phase difference layer PDL, may have a substantially small thickness T (See FIG. 2). Thus, the display device may have a substantially small strain. Therefore, folding and/or unfolding of the display device may be repeated a substantially large number of times without incurring errors and/or defects. According to embodiments of the invention, the display device may prevent reflection of incident light form being visible to a viewer of the display device. Advantageously, visibility of the display device may be optimized.

Figure 9A:
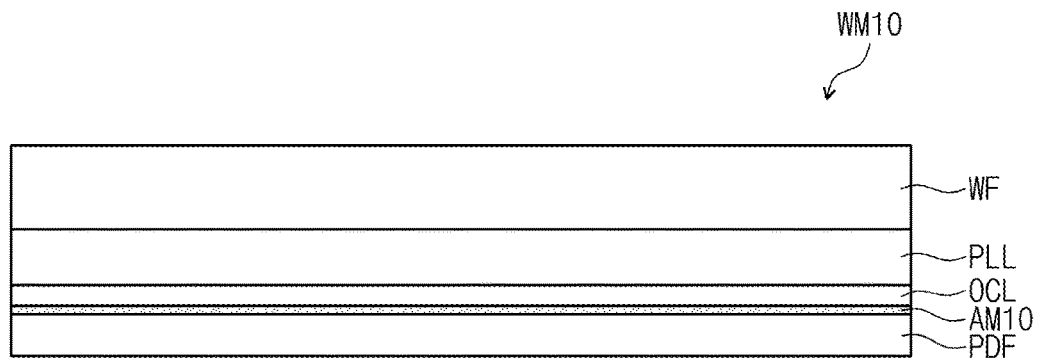
FIG. 9A is a cross-sectional view illustrating a window member of a display device (e.g., a flexible display device) according to some embodiments of the invention.

FIG. 9A is a cross-sectional view illustrating a window member WM10 of a display device (e.g., a flexible display device) according to some embodiments of the invention. Some elements and/or features of the display device associated with FIG. 9A may be substantially identical to or analogous to some elements and/or features described with reference to one or more of FIGS. 1 to 8.

As illustrated in FIG. 9A, the window member WM10 includes a polarizing layer PLL disposed on a bottom surface of a protecting member WF. The polarizing layer PLL may include liquid crystal molecules used as directional members, or directors, for controlling and/or affecting characteristics of light, e.g., for polarizing light. The polarizing layer PLL may be an O-type polarizing layer (which may transmit "ordinary" waves and may block "extraordinary" waves) or an E-type polarizing layer (which may transmit "extraordinary" waves and may block "ordinary" waves).

An overcoat layer OCL may be disposed on a bottom surface of the polarizing layer PLL to cover the aligned liquid crystal molecules. The window member WM10 may include a phase difference film PDF disposed on a bottom surface of the overcoat layer OCL.

The phase difference film PDF may triacetylcellulose film that is drawn and/or elongated in a predetermined direction. The phase difference film PDF may be adhered to the bottom surface of the overcoat layer OCL by an adhesive member AM10.

Figure 9B:
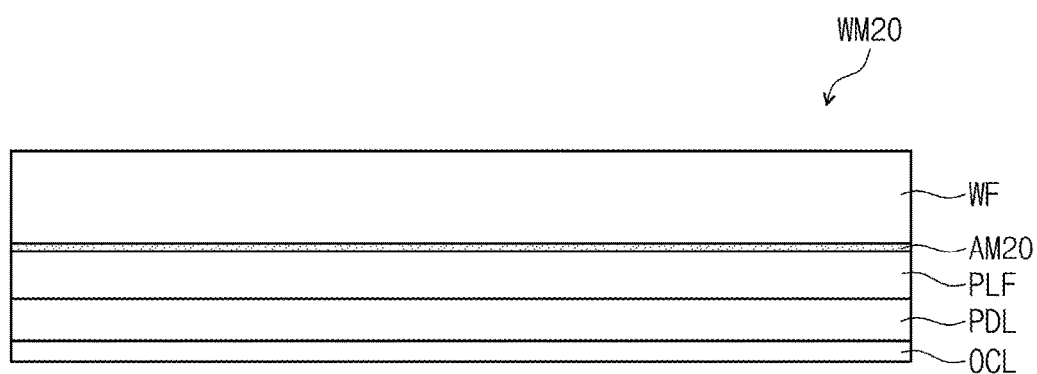
FIG. 9B is a cross-sectional view illustrating a window member of a display device (e.g., a flexible display device) according to some embodiments of the invention.

FIG. 9B is a cross-sectional view illustrating a window member WM20 of a display device (e.g., a flexible display device) according to some embodiments of the invention. Some elements and/or features of the display device associated with FIG. 9B may be substantially identical to or analogous to some elements and/or features described with reference to one or more of FIGS. 1 to 8.

As illustrated in FIG. 9B, the window member WM20 includes a polarizing film PLF disposed on a bottom surface of a protecting member WF. The polarizing film PLF may include a polyvinyl alcohol-based polarizer in which an iodine-based compound or a dichroic polarizing material is adsorbed and aligned. The polyvinyl alcohol-based polarizer may be drawn and/or elongated in a predetermined direction. The polarizing film PLF may further include a triacetylcellulose protecting film for protecting the polyvinyl alcohol-based polarizer. The polarizing film PLF may be adhered to the bottom surface of the protecting member WF by an adhesive member AM20.

A phase difference layer PDL is disposed on a bottom surface of the polarizing film PLF. The phase difference layer PDL includes a reactive mesogen used as a directional member, or director, for controlling and/or affecting characteristics or light. An overcoat layer OCL may be disposed on a bottom surface of the phase difference layer PDL to cover aligned reactive mesogens.

Figure 10:
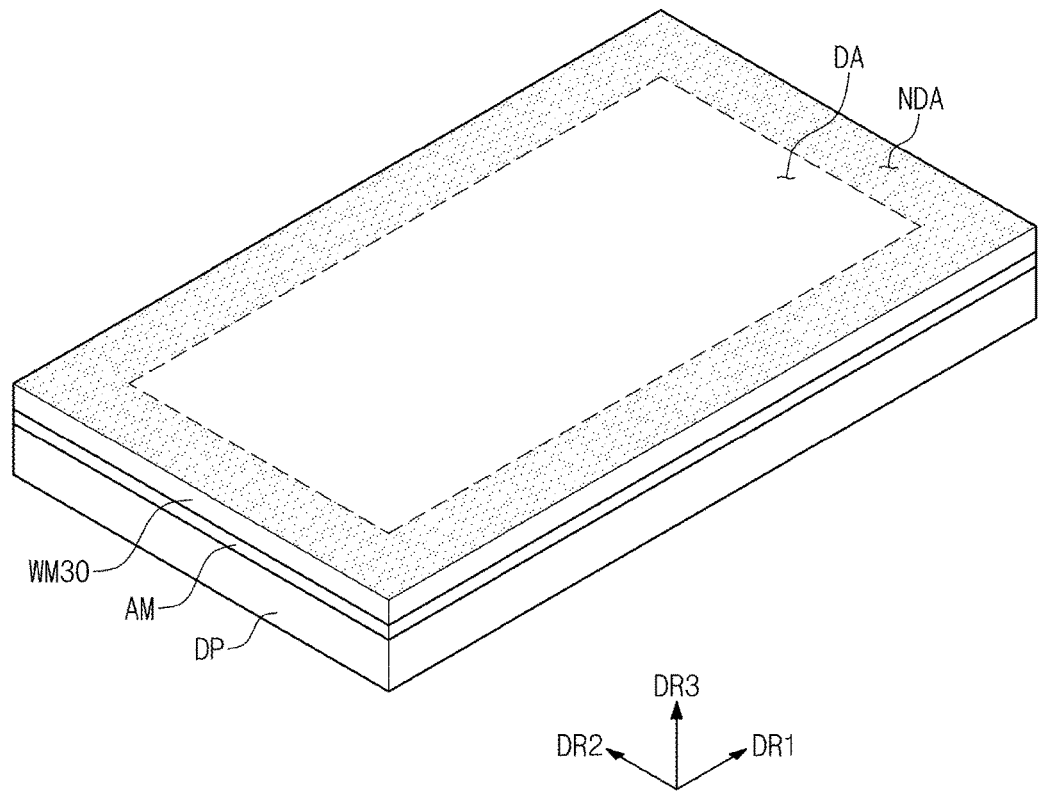
FIG. 10 is a perspective view illustrating a display device (e.g., a flexible display device) according to some embodiments of the invention.
Figure 11:
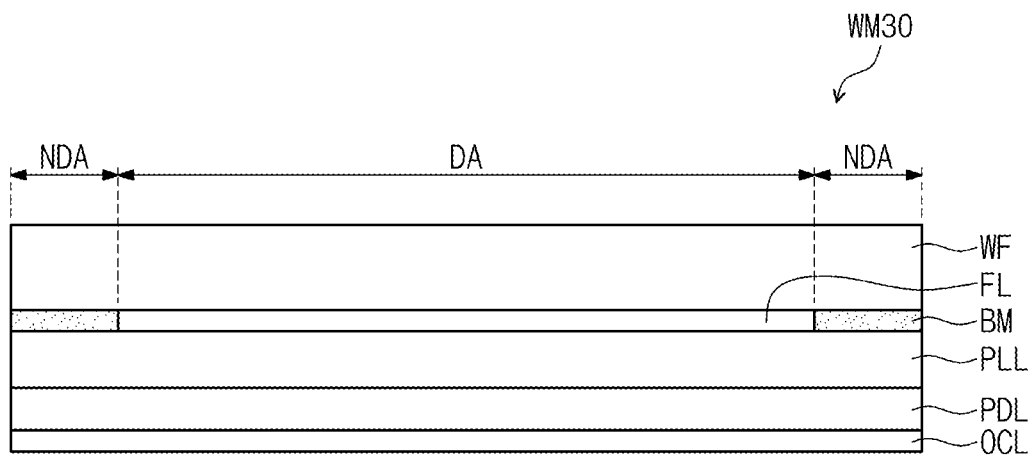
FIG. 11 is a cross-sectional view illustrating a window member of a display device (e.g., a flexible display device) according to some embodiments of the invention.

FIG. 10 is a perspective view illustrating a display device (e.g., a flexible display device) according to some embodiments of the invention. FIG. 11 is a cross-sectional view illustrating a window member WM30 of the display device according to some embodiments of the invention. Some elements and/or features of the display device illustrated in FIG. 10 and/or the window member WM30 may be substantially identical to or analogous to some elements and/or features described with reference to one or more of FIGS. 1 to 9B.

The display device includes a display panel DP and a window member WM30 combined with the display panel DP. The display panel DP may be combined with the window member WM30 by a transparent adhesive member AM.

The display device includes a display region DA and a non-display region NDA. The display region DA and the non-display region NDA may be defined according to existence and nonexistence of pixels. A plurality of pixels is disposed in the display region DA. The pixels are not disposed in the non-display region NDA. Pad portions for signal interconnections may be disposed in the non-display region NDA.

The window member WM30 includes a black matrix BM and a planarization layer FL. The black matrix BM may be or may include an organic layer. The black matrix BM may include a dye or pigment for blocking light. The black matrix BM overlaps the non-display region NDA of the display panel DP such that components disposed in the non-display region NDA of the display panel DP may not be visible outside the display device.

The planarization layer FL may compensate a height difference caused by the black matrix BM. The planarization layer FL may overlap the display region DA of the display panel DP, which may not be substantially overlapped by the black matrix BM. The planarization layer FL may be formed of a transparent plastic resin. The planarization layer FL may have adhesive property.

The black matrix BM and the planarization layer FL may be disposed directly on a bottom surface of a protecting member WF. The black matrix BM and the planarization layer FL may define the same polarization surface on the bottom surface of the protecting member WF. The black matrix BM and the planarization layer FL have substantially the same thickness. A polarizing layer PLL is disposed on a substantially flat surface defined by the black matrix BM and the planarization layer FL. A phase difference layer PDL is disposed on a bottom surface of the polarizing layer PLL, and an overcoat layer OCL is disposed on a bottom surface of the phase difference layer PDL.

In some embodiments of the invention, the planarization layer FL may have adhesive property and may cover the black matrix BM (and overlap the non-display region NDA of the display panel DP). Thus, the planarization layer FL may provide a wider adhesive area and may provide a substantially flat contact surface for combining with the polarizing layer PLL.

Figure 12A:
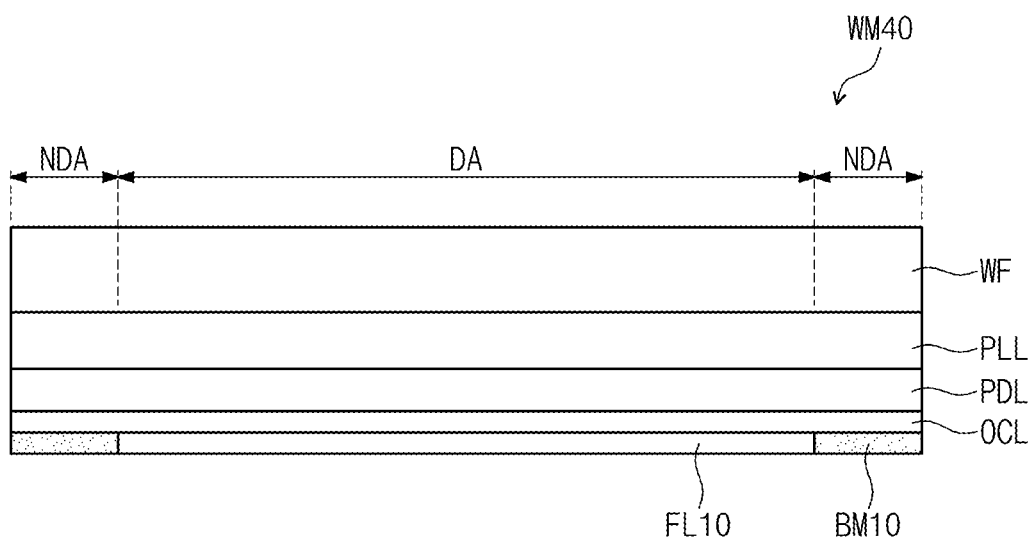
FIG. 12A is a cross-sectional view illustrating a window member of a display device (e.g., a flexible display device) according to some embodiments of the invention.
Figure 12B:
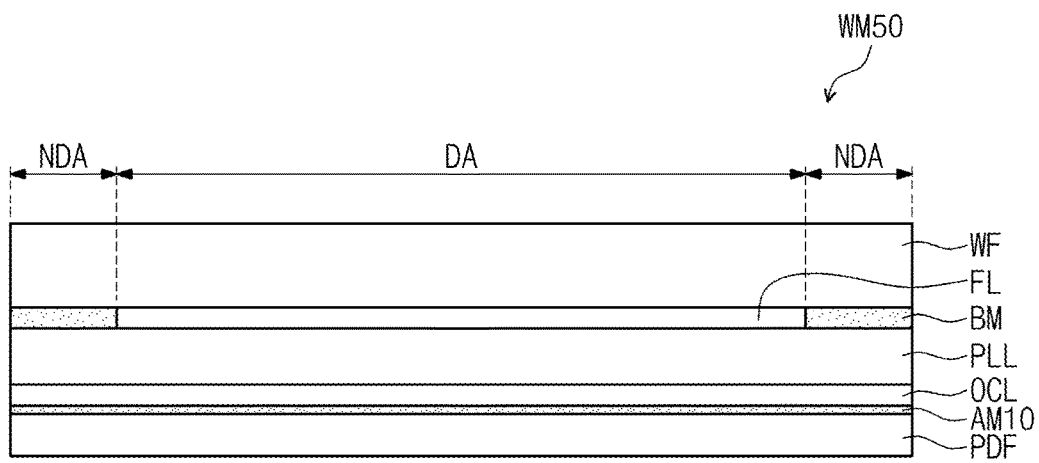
FIG. 12B is a cross-sectional view illustrating a window member of a display device (e.g., a flexible display device) according to some embodiments of the invention.
Figure 12C:
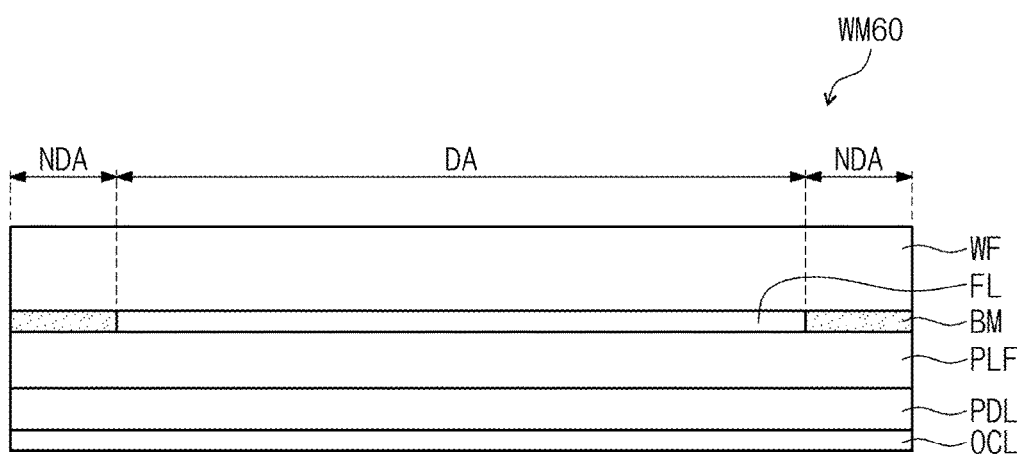
FIG. 12C is a cross-sectional view illustrating a window member of a display device (e.g., a flexible display device) according to some embodiments of the invention.

FIGS. 12A to 12C are cross-sectional views illustrating window members WM40, WM50, and WM60 according to some embodiments of the invention. Each of the window members WM40, WM50, and WM60 may be included in a display device (e.g., a flexible display device). Some elements and/or features of the display device, the window member WM40, the window member WM50, and/or the window member WM60 may be substantially identical to or analogous to some elements and/or features described with reference to one or more of FIGS. 1 to 11. The display device may include a display region DA and a non-display region NDA.

The window member WM40 illustrated in FIG. 12A includes a black matrix BM10 and a planarization layer FL10. The black matrix BM10 and the planarization layer FL10 are disposed on the bottom surface of the overcoat layer OCL. The black matrix BM10 and the planarization layer FL10 define the same planarization surface on the bottom surface of the overcoat layer OCL. In some embodiments of the invention, the black matrix BM10 and the planarization layer FL10 may be disposed between the polarizing layer PLL and the phase difference layer PDL or between the phase difference layer PDL and the overcoat layer OCL.

Each of the window members WM50 and WM60, illustrated in FIGS. 12B and 12C, respectively, includes a black matrix BM and a planarization layer FL that are disposed directly on a bottom surface of a protecting member WF. A structure below a planarization surface provided by the black matrix BM and the planarization layer FL in the window member WM50 illustrated in FIG. 12B may be substantially identical to a corresponding structure of the window member WM10 illustrated in FIG. 9A.

A structure below a planarization surface provided by the black matrix BM and the planarization layer FL in the window member WM60 illustrated in FIG. 12C may be substantially identical to a corresponding structure of the window member WM20 illustrated in FIG. 9B. The planarization layer FL may have adhesive property, so that the adhesive member AM20 illustrated in FIG. 9B may be omitted.

In some embodiments, positions of the black matrix BM and the planarization layer FL may be changed in one or more of the window members WM50 and WM60 illustrated in FIGS. 12B and 12C.

Figure 13:
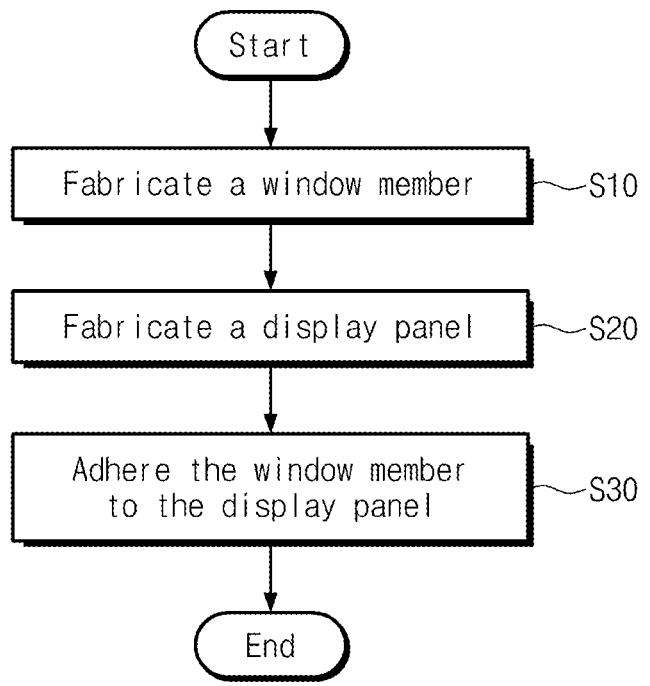
FIG. 13 is a flowchart illustrating a method for fabricating a display device (e.g., a flexible display device) according to some embodiments of the invention.
Figure 14:
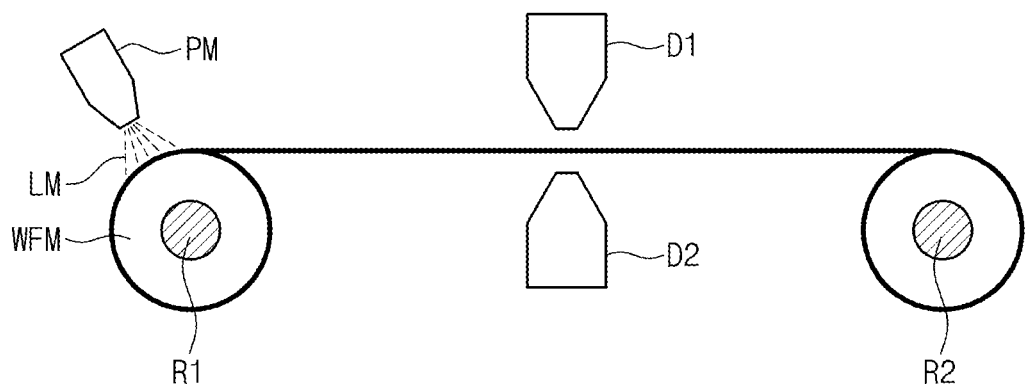
FIG. 14 is a diagram illustrating a method for fabricating a window member for use in a display device (e.g., a flexible display device) according to some embodiments of the invention.

FIG. 13 is a flowchart illustrating a method for fabricating a display device (e.g., a flexible display device) according to some embodiments of the invention. FIG. 14 is a diagram illustrating a method for fabricating a window member for use in a display device (e.g., a flexible display device) according to some embodiments of the invention. Some elements and/or features of the display device and/or the window member may be substantially identical to or analogous to some elements and/or features described with reference to one or more of FIGS. 1 to 12C.

As illustrated in FIG. 13, in step S10, a window member WM is formed (S10). In step S20, a display panel DP is fabricated. Subsequently, in step S30, the window member WM is combined with the display panel DP with the adhesive member AM being disposed between the window member WM and the display panel DP. Fabrication of the window member WM may be performed before, at the same time as, or after fabrication of the display panel DP. Fabricating orders of the window member WM and the display panel DP may be determined according to embodiments of the invention.

Referring to FIG. 14, directional members, or directors, constituting at least one of the polarizing layer PLL and the phase difference layer PDL may be aligned in a roll-to-roll process when the window member WM is formed.

A roll-to-roll apparatus includes two rollers R1 and R2, a supplying part PM, and drying parts D1 and D2. A work film WFM is provided from one of the two rollers R1 and R2 to another of the two rollers R1 and R2. The work film WFM is rolled by a first roller R1. The work film WFM is provided from the first roller R1 to a second roller R2 in the roll-to-roll process. The work film WFM may be or may include a plastic film. The work film WFM may include an alignment layer formed on the plastic film. The work film WFM may be cut into a plurality of cut portions, and a cut portion may be a protecting member WF.

The supplying part PM may provide a solution LM including liquid crystal molecules and an organic solvent for forming the polarizing layer PLL. The liquid crystal molecules are dissolved in the organic solvent. The solution LM that includes the liquid crystal molecules and the organic solvent may be coated on the work film WFM by the supplying part PM. The supplying part PM may be a slit coater.

One of the drying parts D1 and D2 is disposed over portions of the work film WFM spread between the first roller R1 and the second roller R2, and the other of the drying parts D1 and D2 is disposed under the work film. The drying parts D1 and D2 may dry the organic solvent.

Liquid crystal molecules for forming polarizing layers PLL may be disposed on the work film WFM through the above process. Thereafter, a first alignment layer may be formed on the liquid crystal molecules and then may be rubbed in a predetermined direction for orienting the liquid crystal molecules according to the predetermined direction. An alignment axis (or orientation axis) of the first alignment layer may be determined depending on the rubbing direction. The alignment axis (or orientation direction) of the first alignment layer (configured for aligning the liquid crystal molecules) may be oriented at an angle of about 45 degrees with respect to an alignment axis (or orientation direction) of a second alignment layer, which may be configured for aligning the reactive mesogens included in phase difference layers PDL.

After the first alignment layer has been formed on the liquid crystal molecules, reactive mesogens for forming phase difference layers PDL and the second alignment layer may be formed on the aligned liquid crystal molecules. The reactive mesogens and/or the second alignment layer may be provided on the aligned liquid crystal molecules by at least another roll-to-roll apparatus and/or through at least another roll-to-roll process. The second alignment layer may be rubbed in a second predetermined direction. Subsequently, a material for forming overcoat layers OCL may be provided on the phase difference layer PDL material by still another roll-to-roll apparatus and/or through still another roll-to-roll process. The resulted film may be cut into a plurality of window members each including a protecting member WF, a polarizing layer PLL, and a phase difference layer PDL.

In some embodiments, a method for fabricating a window member (e.g., one of the window members WM10 and WM20 illustrated in FIGS. 9A and 9B) may include a process of adhering a polarizing film PLF or a phase difference film PDF to a work film without using an alignment process that involves a roll-to-roll apparatus. For example, the polarizing film PLF may be adhered to the work film, and the phase difference layer PDL may be aligned on the polarizing film PLF.

In some embodiments, a method for fabricating a window member (e.g., one of the window members WM30, WM40, WM50, and WM60 illustrated in FIGS. 10, 11, 12A, 12B, and 12C) may include a process of forming a black matrix BM and a process of forming a planarization layer FL. The black matrix BM and/or the planarization layer FL may be formed in an inkjet printing process and/or a nozzle printing process.

The display panel DP, which may include signal interconnections, pixels, and a sealing layer, may be fabricated through one or more deposition processes, one or more photolithography processes, one or more exposure processes, and/or one or more etching processes.

According to embodiments of the invention, at least one of the polarizing member and the phase difference member may not be provided as a film with a substantially large thickness, but may formed by directly providing directional members (e.g., liquid crystal molecules and/or mesogens) on the protecting member. The directional members of the polarizing member and the phase difference member may be oriented to perform predetermined optical functions without substantially adding to the thickness of the display device. Advantageously, the display device may be substantially slim, flexible, and durable.

According to embodiments of the invention, the polarizing member and the phase difference member included in the window member prevent reflection of incident light on the display device from being visible outside the display device. Thus, visibility of images displayed by the display device may be optimized.

According to embodiments of the invention, the directional members of the polarizing member and the phase difference member may be provided and oriented directly on the flexible protecting member using the roll-to-roll method. Advantageously, efficiency of fabrication of window members may be maximized.

While the invention has been described with reference to example embodiments, various changes and modifications may be made without departing from the spirits and scopes of the invention. The above embodiments are illustrative, but not limiting. The scopes of the invention are to be determined by the broadest permissible interpretation of the following claims and their equivalents.

What is claimed is:

1. A display device comprising:
   a display panel including a plurality of display elements;
   a protective member overlapping the display panel and comprising a first face and a second face, wherein the first face is opposite the second face, wherein the second face is closer to the display panel than the first face, and wherein a material of the first face is identical to a material of the second face;
   an alignment layer disposed directly on the second face;
   a polarizing layer disposed directly on the alignment layer, the polarizing layer including liquid crystal molecules arranged in a predetermined direction; and
   a phase difference layer disposed directly on the polarizing layer, the phase difference layer including reactive mesogens.

2. The display device of claim 1, further comprising an over coat layer disposed directly on the phase difference layer.

3. The display device of claim 1, wherein an optic axis of the phase difference layer makes an angle of about 45 degrees with an optic axis of the polarizing layer.

4. The display device of claim 1, further comprising:
   a black matrix disposed between the display panel and the protective member and overlapping a non-display region of the display panel; and
   a planarization layer overlapping a display region of the display panel, wherein a portion of the planarization layer is disposed between two portions of the black matrix.

5. The display device of claim 1, wherein the plurality of display elements includes organic light emitting diodes.

6. The display device of claim 1, wherein the display device includes a curved portion having a predetermined radius of curvature.

7. The display device of claim 1, wherein the display device is configured to be folded with respect to an axis.

* * * * *